(12) United States Patent
Iwayama et al.

(10) Patent No.: US 9,231,193 B2
(45) Date of Patent: Jan. 5, 2016

(54) MAGNETIC MEMORY AND MANUFACTURING METHOD THEREOF

(71) Applicants: Masayoshi Iwayama, Seoul (KR); Hisanori Aikawa, Seoul (KR)

(72) Inventors: Masayoshi Iwayama, Seoul (KR); Hisanori Aikawa, Seoul (KR)

( * ) Notice: Subject to any disclaimer, the term of this patent is extended or adjusted under 35 U.S.C. 154(b) by 1 day.

(21) Appl. No.: 14/200,336

(22) Filed: Mar. 7, 2014

(65) Prior Publication Data

US 2015/0069547 A1    Mar. 12, 2015

Related U.S. Application Data

(60) Provisional application No. 61/874,815, filed on Sep. 6, 2013.

(51) Int. Cl.
*H01L 43/02*    (2006.01)
*H01L 43/12*    (2006.01)

(52) U.S. Cl.
CPC ............... *H01L 43/02* (2013.01); *H01L 43/12* (2013.01)

(58) Field of Classification Search
None
See application file for complete search history.

(56) References Cited

U.S. PATENT DOCUMENTS

| | | | | |
|---|---|---|---|---|
| 5,200,635 A * | 4/1993 | Kaga et al. | ............ | 257/306 |
| 5,644,838 A * | 7/1997 | Beratan | ............ | 29/840 |
| 5,843,847 A * | 12/1998 | Pu et al. | ............ | 438/723 |
| 8,264,053 B2 | 9/2012 | Tsukamoto et al. | | |
| 2006/0133174 A1* | 6/2006 | Kim et al. | ............ | 365/222 |
| 2012/0032289 A1* | 2/2012 | Ohmori et al. | ............ | 257/427 |
| 2012/0056253 A1 | 3/2012 | Iwayama et al. | | |
| 2012/0122299 A1* | 5/2012 | Wang et al. | ............ | 438/458 |
| 2012/0211847 A1 | 8/2012 | Tsukamoto et al. | | |

FOREIGN PATENT DOCUMENTS

| | | |
|---|---|---|
| JP | 2005-183579 A | 7/2005 |
| JP | 2005-340260 A | 12/2005 |
| JP | 2012-204431 A | 10/2012 |

\* cited by examiner

*Primary Examiner* — Bilkis Jahan
*Assistant Examiner* — Kevin Quinto
(74) *Attorney, Agent, or Firm* — Holtz, Holtz, Goodman & Chick PC

(57) ABSTRACT

According to one embodiment, a magnetic memory includes a magnetoresistive effect element provided in a memory cell, the magnetoresistive effect element including a multilayer structure including a first magnetic layer, a second magnetic layer, and a nonmagnetic layer between the first magnetic layer and the second magnetic layer, a first electrode provided on an upper portion of the multilayer structure and including a first material, and a first film provided on a side surface of the first electrode and including a second material which is different from the first material of the first electrode.

13 Claims, 11 Drawing Sheets

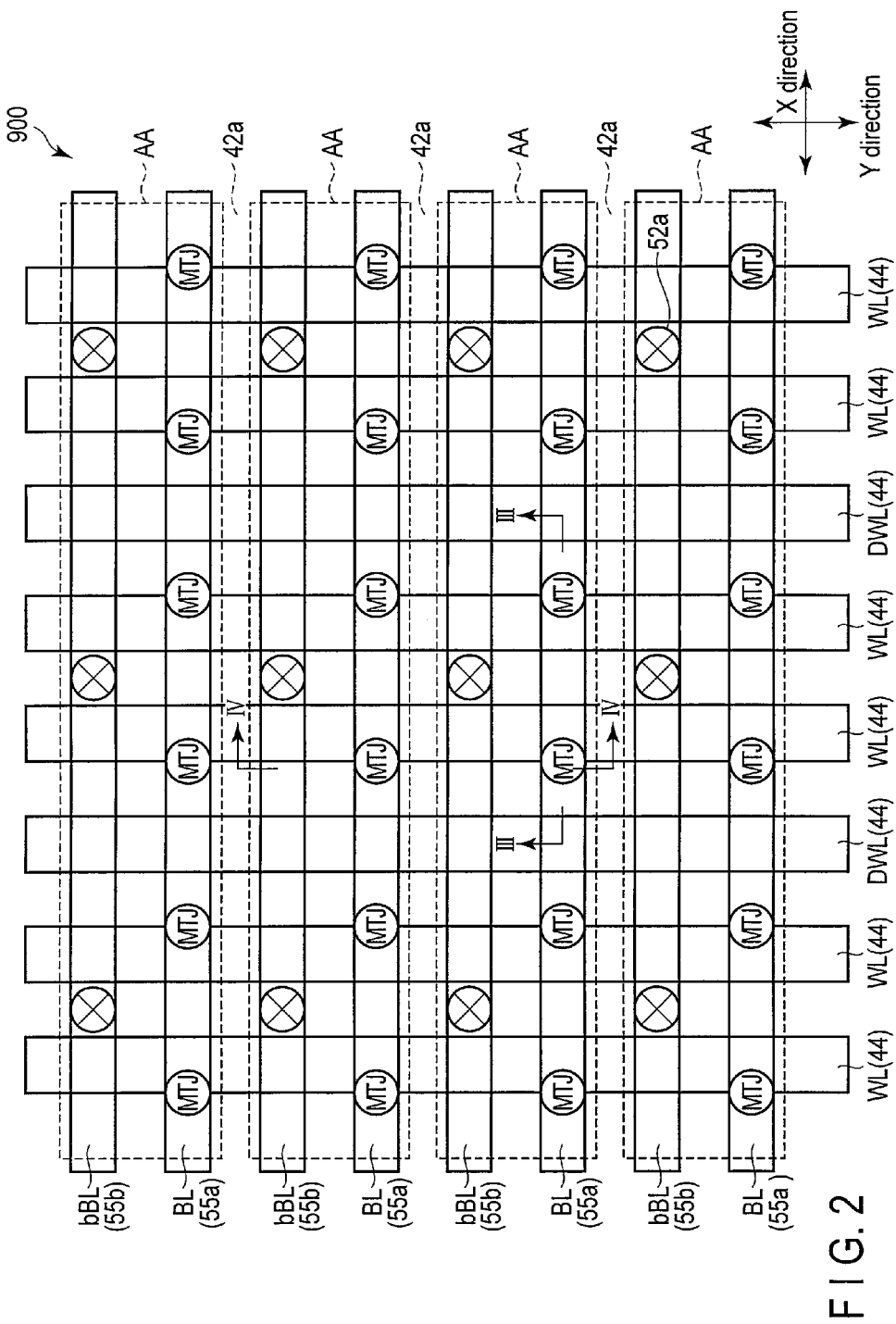
F I G. 2

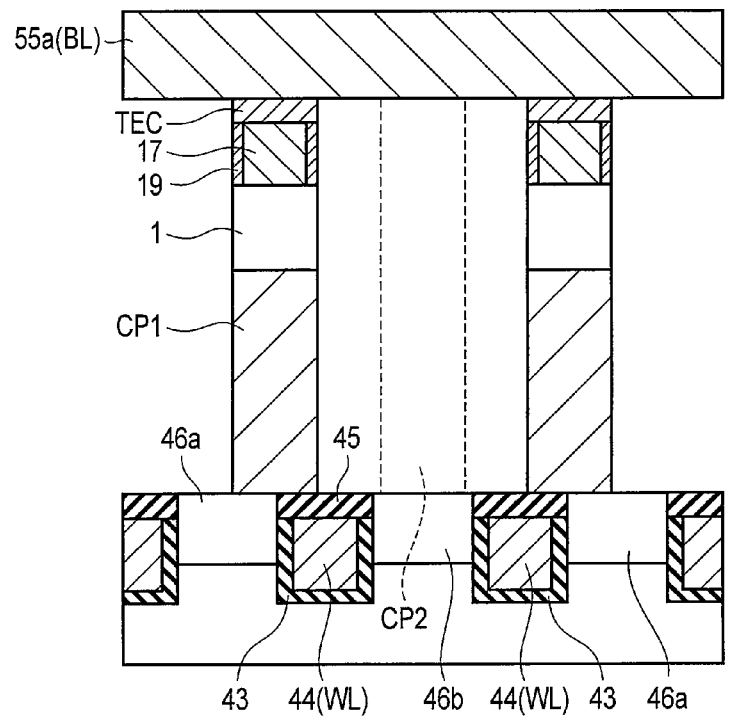
F I G. 3
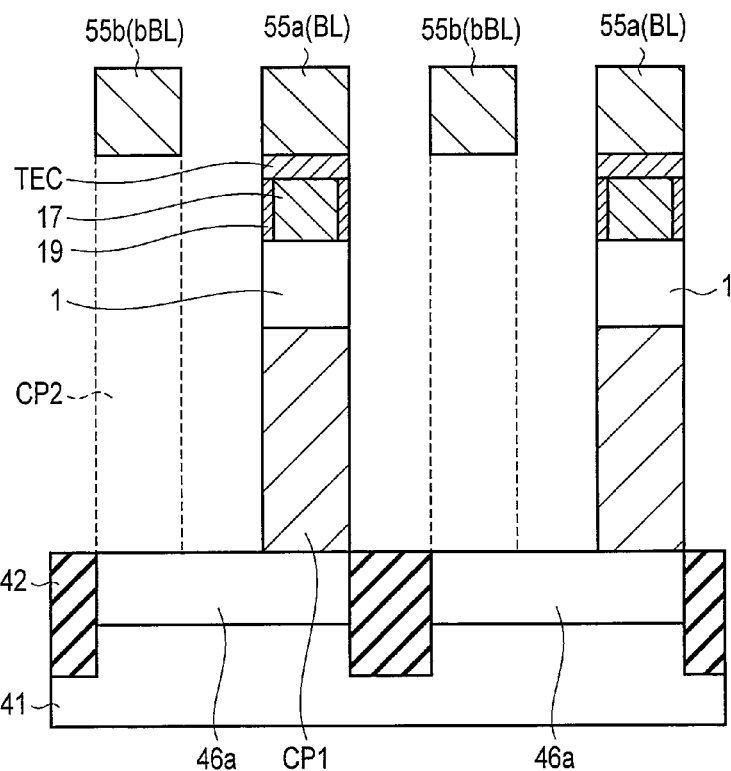
F I G. 4

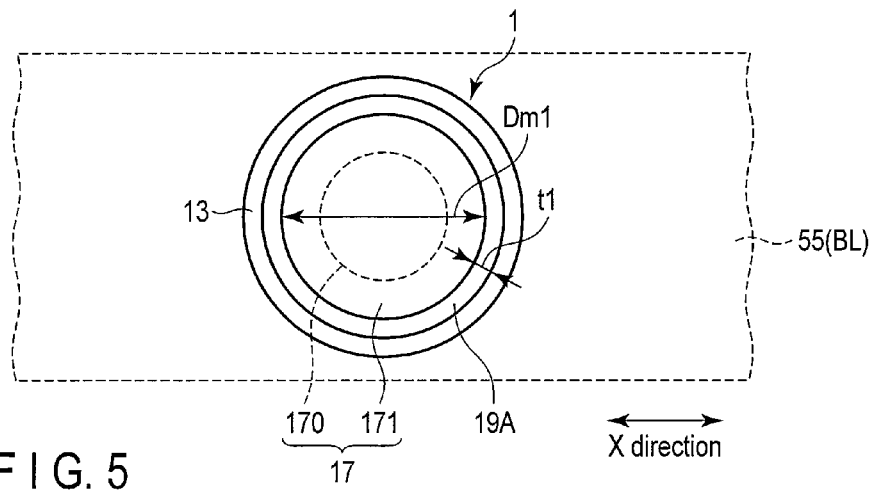
F I G. 5
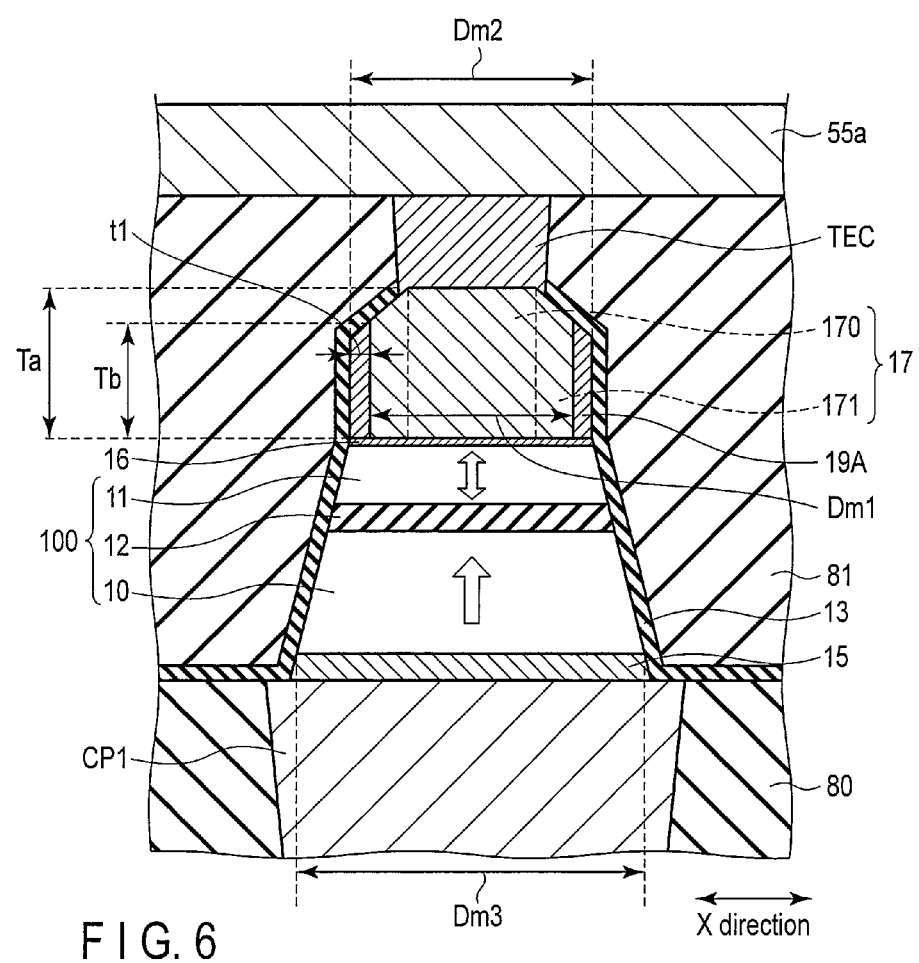
F I G. 6

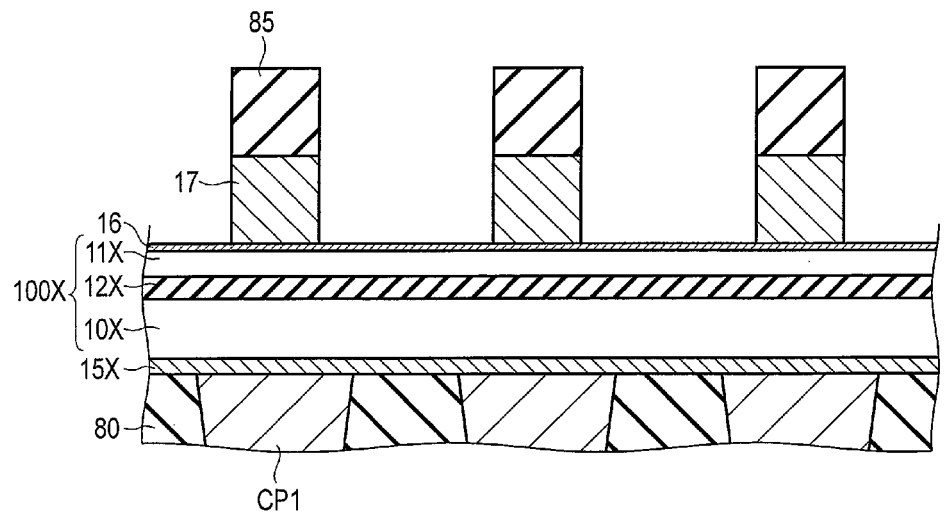
F I G. 7
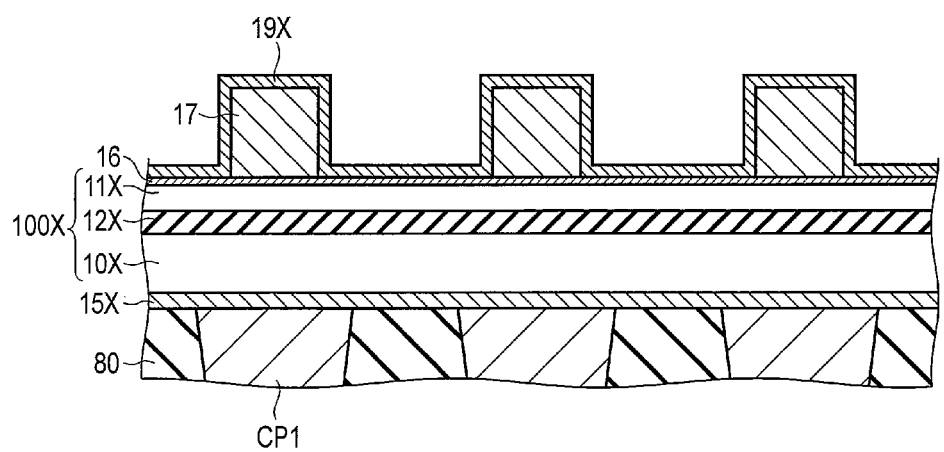
F I G. 8

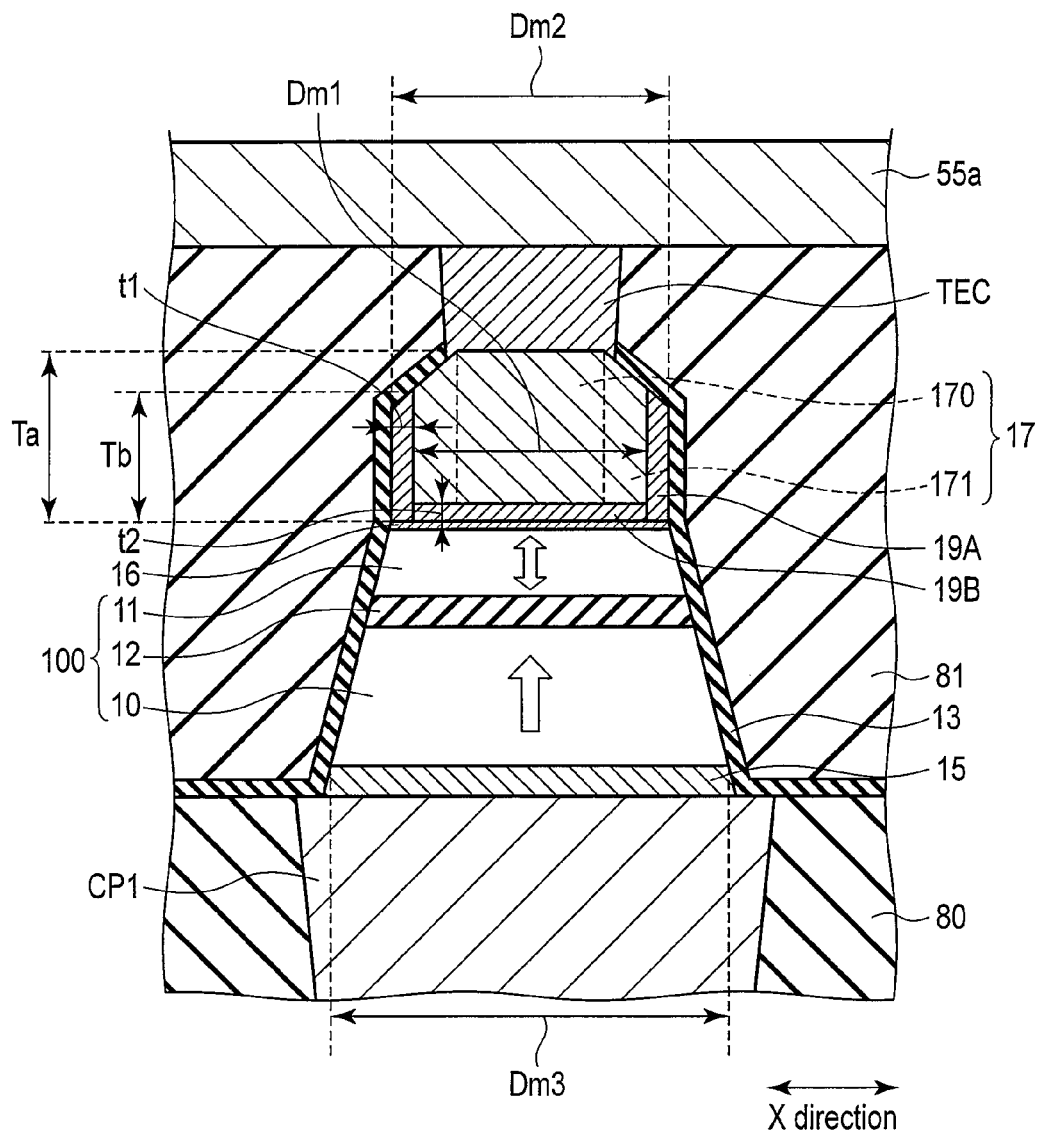
F I G. 12

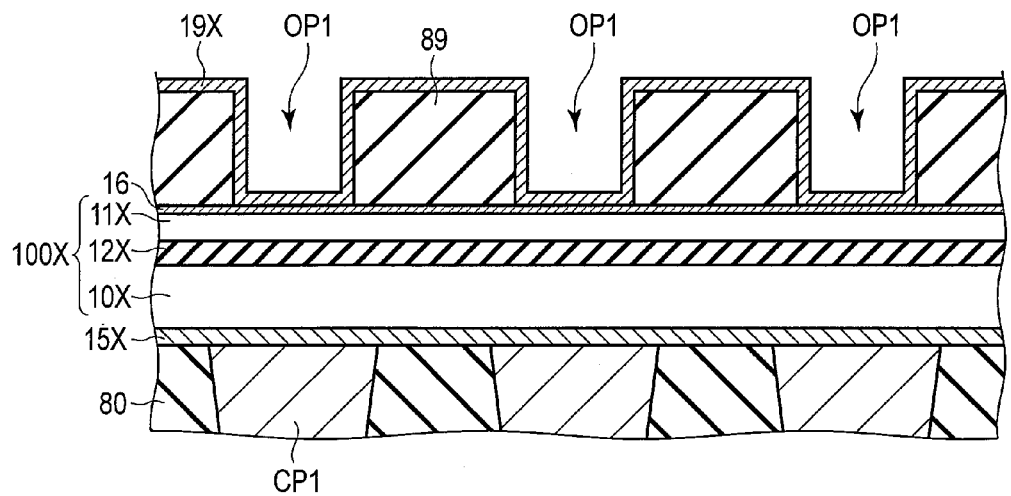
F I G. 13
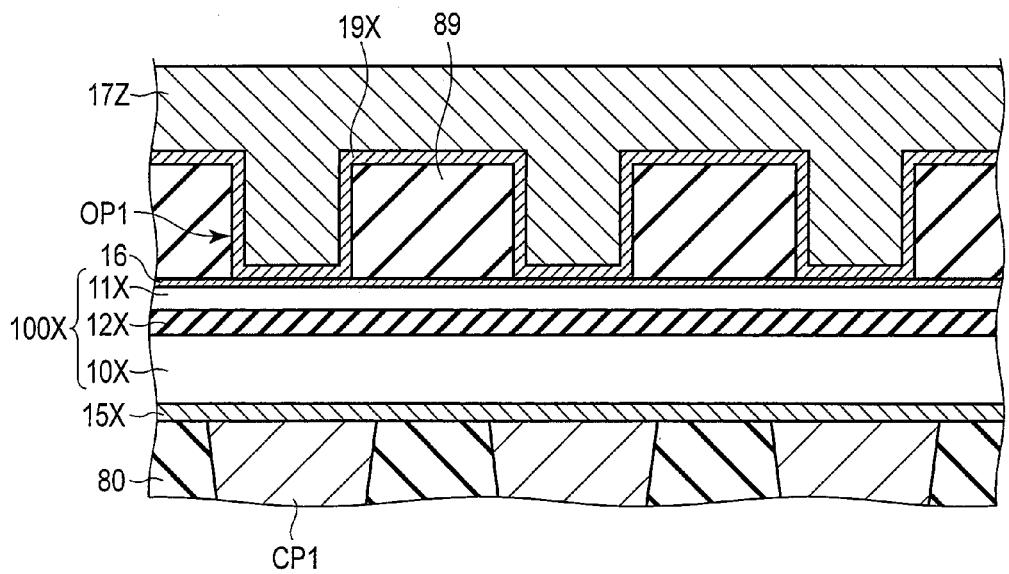
F I G. 14

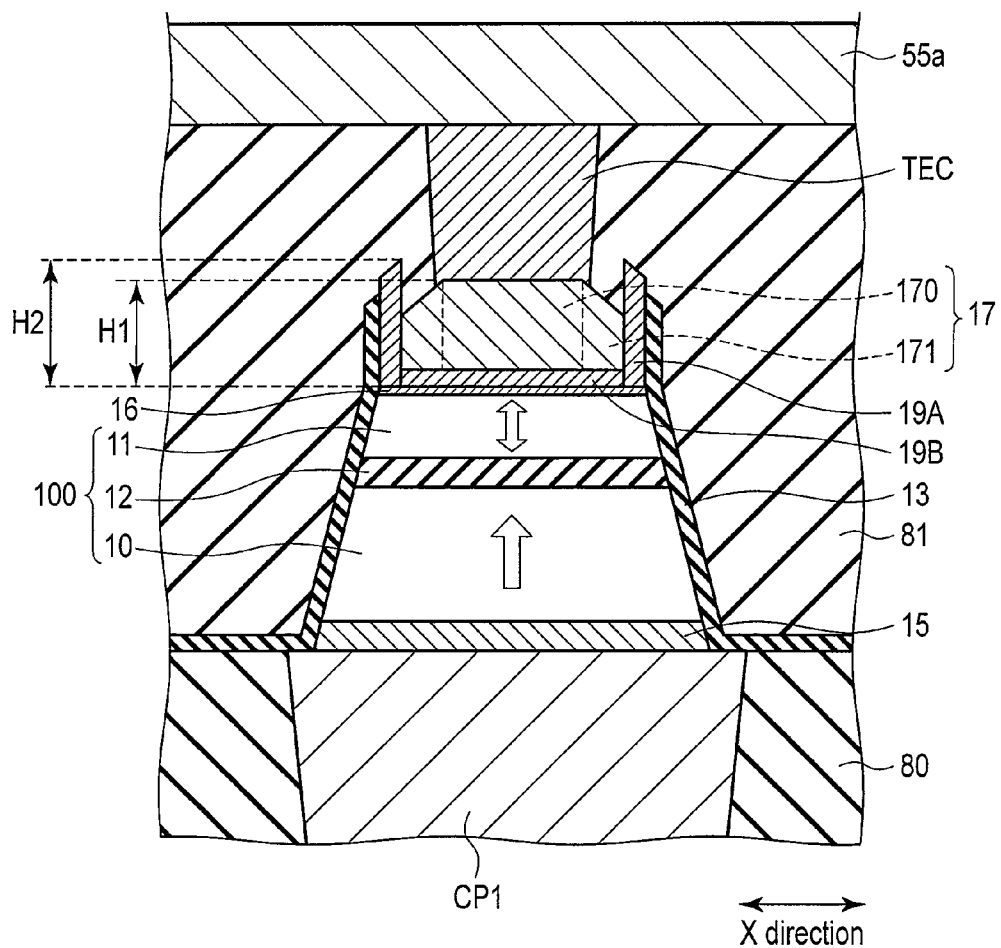
F I G. 17

MAGNETIC MEMORY AND MANUFACTURING METHOD THEREOF

CROSS-REFERENCE TO RELATED APPLICATIONS

This application claims the benefit of U.S. Provisional Application No. 61/874,815, filed Sep. 6, 2013, the entire contents of which are incorporated herein by reference.

FIELD

Embodiments described herein relate generally to a magnetic memory and a manufacturing method of the magnetic memory.

BACKGROUND

In recent years, a spin transfer torque-type magnetoresistive random access memory (STT-MRAM) has been proposed as one of semiconductor memories. In the MRAM, a magnetoresistive effect element is included in a memory cell. The magnetoresistive effect element includes two magnetic layers (ferromagnetic layers) and a nonmagnetic layer which is provided between the two magnetic layers. Depending on the magnetization states of the two magnetic layers of the magnetoresistive effect element, that is, depending on whether the spin directions of the two magnetic layers are parallel or antiparallel, "1" or "0" information is stored in the memory cell.

BRIEF DESCRIPTION OF THE DRAWINGS

FIG. 2 is a view illustrating a layout example of a memory cell array of the magnetic memory.

FIG. 3 is a view which schematically illustrates a cross-sectional structure of the memory cell array of the magnetic memory.

FIG. 4 is a view which schematically illustrates a cross-sectional structure of the memory cell array of the magnetic memory.

FIG. 5 is a view illustrating a structure example of a magnetoresistive effect element of a magnetic memory according to a first embodiment.

FIG. 6 is a view illustrating a structure example of the magnetoresistive effect element of the magnetic memory of the first embodiment.

FIG. 7 is a cross-sectional view illustrating a fabrication step of a manufacturing method of the magnetic memory of the first embodiment.

FIG. 8 is a cross-sectional view illustrating a fabrication step of the manufacturing method of the magnetic memory of the first embodiment.

FIG. 12 is a view illustrating a structure example of a magnetoresistive effect element of a magnetic memory according to a second embodiment.

FIG. 13 is a cross-sectional view illustrating a fabrication step of a manufacturing method of the magnetic memory of the second embodiment.

FIG. 14 is a cross-sectional view illustrating a fabrication step of the manufacturing method of the magnetic memory of the second embodiment.

FIG. 17 is a view illustrating a modification of the magnetic memory of the embodiment.

DETAILED DESCRIPTION

Figure 1:
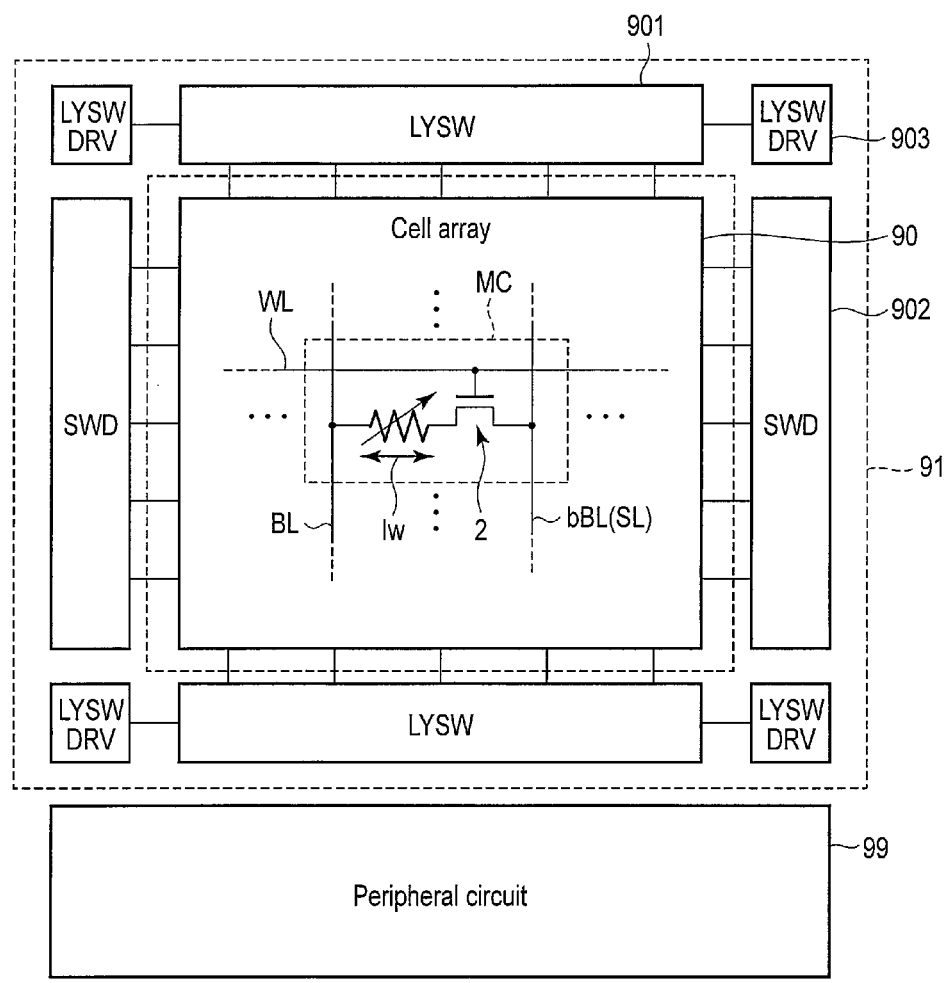
FIG. 1 is a view illustrating a structure example of a magnetic memory.

Various embodiments will be described hereinafter in detail with reference to the accompanying drawings. In the description below, elements having the same functions and structures are denoted by like reference numerals, and an overlapping description will be given only where necessary.

In general, according to one embodiment, a magnetic memory includes: a magnetoresistive effect element provided on a substrate, the magnetoresistive effect element including: a multilayer structure including a first magnetic layer, a second magnetic layer, and a nonmagnetic layer between the first magnetic layer and the second magnetic layer; a first electrode provided on an upper surface of the multilayer structure and including a first material; and a first film provided on a side surface of the first electrode and including a second material which is different from the first material.

EMBODIMENTS

(1) First Embodiment

Referring to FIG. 1 to FIG. 11, a magnetic memory according to a first embodiment will be described.

(a) Structure

The structure of the magnetic memory according to the first embodiment is described with reference to FIG. 1 to FIG. 6.

FIG. 1 is a block diagram illustrating the whole structure of the magnetic memory according to the first embodiment.

As shown in FIG. 1, the magnetic memory includes a cell array 90, a core circuit 91 and a peripheral circuit 99. The magnetic memory of this embodiment is, for example, a magnetoresistive RAM (MRAM).

The cell array 90 includes a plurality of memory cells MC. The memory cells MC are arranged in a matrix in the cell array 90. Data is stored in each memory cell.

The memory cell MC of the MRAM includes, for example, one magnetoresistive effect element as a memory element 1, and a cell transistor (e.g. a field-effect transistor with a buried gate structure) 2 as one select element.

Two bit lines BL and bBL and one word line WL are connected to the memory cell MC. One end (source/drain) of a current path of the cell transistor 2 is connected to one bit line BL, the other end (drain/source) of the current path of the cell transistor 2 is connected to one end of the magnetoresistive effect element 1, and the other end of the magnetoresistive effect element 1 is connected to the other bit line bBL. A control terminal (gate) of the cell transistor 2 is connected to the word line WL. The bit lines BL and bBL extend in a Y direction (column direction), and the word line WL extends in an X direction (row direction).

In the case where the MRAM of the embodiment is an STT-type MRAM, a write current Iw is supplied in the magnetoresistive effect element 1 at a time of writing data to the memory cell.

The core circuit 91 is electrically connected to the cell array 90. Data is transferred between the core circuit 91 and the cell array 90. The core circuit 91 includes a local column switch circuit (LYSW) 901, a sub-word line decoder (SWD) 902, and a local column switch driver (LYSWDRV) 903.

The local column switch circuit 901 selectively connects the bit line BL, bBL and a global bit line (not shown) in accordance with a column address in a magnetic memory in which a hierarchical bit line scheme is adopted. After receiving a row address, the sub-word line decoder 902 decodes the received row address. The local column switch driver 903 controls ON/OFF of local column switches of the local column switch circuit 901.

For example, the local column switch circuit 901 includes a transistor with a buried gate electrode, the sub-word line decoder 902 includes a planar-type transistor, and the local column switch driver 903 includes both the buried gate-type transistor and the planar-type transistor.

The peripheral circuit 99 is electrically connected to the cell array 90 via the core circuit 91. The peripheral circuit 30 includes, for example, a control circuit which controls the core circuit 91 and cell array 90, a voltage generation circuit, and a current generation circuit.

The cell array 90, core circuit 91 and peripheral circuit 99 are formed on the same semiconductor substrate 41.

Referring to FIG. 2 to FIG. 4, the structure of the cell array of the MRAM of the embodiment is described. In FIG. 3 and FIG. 4, members, which are located on the background or foreground in the Figures, are indicated by broken lines. In addition, in FIG. 3 and FIG. 4, depiction of interlayer insulation films on the semiconductor substrate is omitted.

FIG. 2 is a plan view illustrating the cell array 90 of the MRAM of the embodiment. FIG. 3 schematically shows a cross section along line in FIG. 2. FIG. 4 schematically shows a cross section along line IV-IV in FIG. 2.

For example, in the cell array 90, a plurality of word lines WL and a plurality of dummy word lines DWL, which extend in the X direction, and a plurality of bit lines BL and bBL (SL), which extend in the Y direction, are arranged. Two word lines WL and one dummy word line DWL are alternately arranged in the X direction.

As illustrated in FIG. 2 to FIG. 4, in the cell array 90, device isolation regions, which extend in the Y direction, are provided in a surface region of a p-type semiconductor substrate (e.g. silicon substrate) 41. Device isolation insulation layers 42a are provided in the device isolation regions. Those parts of the surface region of the semiconductor substrate 41, in which the device isolation insulation layers 42a are not provided, become active areas AA. The device isolation regions and active areas AA are alternately arranged in the X direction. The device isolation insulation layer 42 has, for example, a shallow trench isolation (STI) structure. An insulative material with a high burying characteristic, such as silicon nitride (SiN), is used for the device isolation insulation layer 42.

The cell transistor 2 is provided on the semiconductor substrate 41. The cell transistor 2 is, for example, an n-channel type MOS transistor.

The cell transistor 2 includes a gate electrode 44 which is buried in a recess in the semiconductor substrate 41. A gate insulation film 43 is provided between the semiconductor substrate 41 and the gate electrode 44. In the description below, the gate structure, which is buried in the semiconductor substrate, is referred to as "buried gate structure".

The gate insulation film 43 is formed on an inner surface of the recess. The gate electrode 44 is formed on the inner surface of the gate insulation film 43 so as to fill a lower side part of the recess. The gate electrode 44 is formed so as to extend in the X direction. The gate electrode 44 is used as the word line WL. The gate electrode 44, which is buried in the recess, includes, for example, polysilicon.

An insulation film 45, which is formed of, e.g. SiN, is provided on upper surfaces of the gate insulation film 43 and gate electrode 44 so as to fill an upper side part of the recess. The upper surface of the insulation film 45 is substantially on a level with the upper surface of the semiconductor substrate 41.

A diffusion layer (hereinafter referred to as "source/drain diffusion layer") 46a, 46b, which functions as a source/drain of the cell transistor 2, is formed such that the gate insulation film 43, gate electrode 44 and insulation film 45 are interposed between source/drain diffusion layers 46a and 46b. The source/drain diffusion layer 46a, 46b of the cell transistors 2 of two memory cells, which neighbor in the Y direction, are shared by the two memory cells which neighbor in the Y direction.

As illustrated in FIG. 3 and FIG. 4, the source/drain diffusion layers 46a, 46b are isolated by the device isolation regions (device isolation insulation layers 42) along the Y direction.

In the meantime, of the three gate electrodes 44 neighboring in the X direction, two gate electrodes 44 correspond to word lines WL which are connected to the memory cells, and the other gate electrode 44 corresponds to the dummy word line DWL. The memory cells MC are electrically isolated by controlling the potential of the dummy word line DWL.

An interlayer insulation film (not shown) is provided on the semiconductor substrate 41. Contact plugs CP1 and CP2 are provided in the interlayer insulation film such that the contact plugs CP1 and CP2 are connected to the source/drain diffusion layers 46a and 46b of the cell transistors 2.

The magnetoresistive effect element 1 is provided on the contact plug CP1, and a lower electrode of the magnetoresistive effect element 1 is connected to the contact plug CP1. The contact plug CP1 includes, for example, tantalum and titanium nitride, but the embodiment is not limited to this example. A wiring 55a serving as the bit line BL is provided on an upper electrode 17 of the magnetoresistive effect element 1 via a via-plug TEC. An electrically conductive side wall film 19A is provided on the side surface of the upper electrode 17.

The contact plug CP2 is provided in the interlayer insulation film, and a wiring 55b serving as the bit line bBL is connected to the source/drain diffusion layer 46b of the cell transistor 2 by the contact plug CP2.

Two bit lines BL and bBL, which constitute a bit line pair, are provided on the same wiring level, but the embodiment is not limited to this example.

In this embodiment, the lower electrode, which is connected to the magnetoresistive effect element 1, and the upper electrode 17 are described as parts of the structural elements of the magnetoresistive effect element, but the embodiment is not limited to this example.

Referring now to FIG. 5 and FIG. 6, a description is given of the structure of the magnetoresistive effect element of the MRAM of the embodiment.

FIG. 5 is a plan view which schematically illustrates a plan-view structure of the magnetoresistive effect element of the MRAM of the embodiment. FIG. 6 is a cross-sectional view which schematically illustrates a cross-sectional structure of the magnetoresistive effect element of the MRAM of the embodiment.

As illustrated in FIG. 5 and FIG. 6, the magnetoresistive effect element in this embodiment has a circular plan-view shape, and has a columnar structure. A magnetoresistive effect element 1 is provided on the contact plug CP1.

As shown in FIG. 6, the magnetoresistive effect element 1 includes a first magnetic layer 10, a second magnetic layer 11, and a nonmagnetic layer 12 between the two magnetic layers 10 and 11. A multilayer structure 100 including the two magnetic layers 10 and 11 and the nonmagnetic layer constitutes a magnetic tunnel junction 100. In the description below, the magnetoresistive effect element 1 including the magnetic tunnel junction is also referred to as "MTJ element 1".

For example, the multilayer structure 100 of the magnetoresistive effect element 1 has a tapered cross-sectional shape. The dimension of an upper side portion of the magnetoresistive effect element 1 in a horizontal direction to the surface of the semiconductor substrate, is smaller than the dimension of a bottom side portion of the magnetoresistive effect element 1.

In the MTJ element 1 of the embodiment, the nonmagnetic layer 12 is formed of an insulator. In the description below, the nonmagnetic layer 12 formed of the insulator is referred to as a tunnel barrier layer 12.

The direction of magnetization of one of the two magnetic layers 10 and 11 of the MTJ element is variable, and the direction of magnetization of the other magnetic layer is invariable (fixed state). In the description below, the magnetic layer, which has a variable direction of magnetization, is referred to as a "memory layer (storage layer)", and the magnetic layer, which has an invariable direction of magnetization, is referred to as a "reference layer".

That the direction of magnetization of the magnetic layer is variable means that the direction of magnetization of the magnetic layer is varied by a predetermined write current Iw which is supplied to the MTJ element at a time of writing data in the memory cell. That the direction of magnetization of the magnetic layer is invariable means that the direction of magnetization of the magnetic layer is not varied by the predetermined write current Iw. Specifically, the reference layer has a greater magnetization inversion threshold (a magnetization direction inversion energy barrier) than the memory layer.

In the data write of the STT-MRAM, a write current Iw, which flows in a direction perpendicular to the film surface of the magnetic layer 10, 11, flows in the MTJ element 1 which functions as the memory element. The direction of the write current Iw is varied in accordance with data that is to be written.

When the write current IW flows from the memory layer to the reference layer, the electrons of the write current Iw move from the reference layer toward the memory layer. In this case, the electrons, which are spin-polarized in the same direction as the direction of magnetization of the reference layer, are injected in the memory layer. A spin angular momentum of the spin-polarized electrons is applied to the spin which forms the magnetization of the memory layer. Thereby, the direction of magnetization of the memory layer is set to be identical to the direction of magnetization of the reference layer, and the direction of magnetization of the reference layer and the direction of magnetization of the memory layer are oriented in parallel.

When the orientation of magnetization of the reference layer and memory layer is parallel orientation, the resistance value of the MTJ element 1 is lowest. For example, data "0" is assigned to the low resistance state of the MTJ element 1.

On the other hand, when the write current Iw flows from the reference layer to the memory layer, the electrons of the write current Iw move from the memory layer toward reference layer. In this case, the electrons in a direction opposite to the direction of magnetization of the reference layer, which are reflected by the reference layer, are injected in the memory layer as spin-polarized electrons. An angular momentum of the spin-polarized electrons (electrons reflected by the reference layer) is applied to the spin of the reference layer, and the direction of magnetization of the memory layer is set to be opposite to the direction of magnetization of the reference layer. Thereby, the direction of magnetization of the reference layer and the direction of magnetization of the memory layer are oriented to be antiparallel.

When the orientation of magnetization of the reference layer and memory layer is antiparallel orientation, the resistance value of the MTJ element is highest. For example, data "1" is assigned to the high resistance state of the MTJ element 1.

In addition, read-out of data of the STT-MRAM is executed by supplying a read current, which is smaller than the write current Iw, into the MTJ element 1. The read current is set at such a magnitude that no inversion occurs in the magnetization direction of the reference layer 10. A variation of the potential/current value of the bit line BL at a time when the read current has been supplied to the MTJ element 1 is detected, and thereby the data "0" and "1" of the MTJ element 1 in the memory cell can be discriminated. In the embodiment, for the purpose of clearer descriptions, of the two bit lines BL and bBL, the bit line bBL, which is set on a low potential side at the time of data read-out, is referred as "source line".

In the example illustrated in FIG. 6, the memory layer 11 is stacked on the reference layer 10 via the tunnel barrier layer 12. The tunnel barrier layer 12 is provided on the reference layer 10. The structure in which the reference layer 10 is provided on the bottom side of the MTJ element is called "bottom pin structure" (or "top free structure"). However, the MTJ element of the embodiment may have a top pin structure (also referred to as "bottom free structure").

The reference layer 10 and memory layer 11 are formed of ferromagnetic layers or artificial lattices. For example, a single-layer structure or a multilayer structure (artificial lattice) of a magnetic material including cobalt (e.g. CoFeB, CoPt), or a ferrimagnetic material (e.g. TbCoFe) is used for the reference layer 10 and memory layer 11. Mutually different materials may be used for the reference layer 10 and memory layer 11. A film consisting mainly of MgO is used for the tunnel barrier layer 12.

For example, the reference layer 10 and memory layer 11 have such a vertical magnetic anisotropy that the direction of magnetization is perpendicular or substantially perpendicular to the film surface (upper surface/lower surface) of each layer. In this context, "substantially perpendicular" means that the residual magnetization direction is in a range of $45° < \theta \leq 90°$, relative to the film surface. Incidentally, the reference layer 10 and memory layer 11 may have such an in-plane magnetic anisotropy that the direction of magnetization is horizontal (or substantially horizontal) to the film surface of each layer.

In the meantime, a functional layer, which is called an interface layer, may be provided near an interface between the magnetic layer 10, 11 and the tunnel barrier layer 12 in the MTJ element 1, as a part of the reference layer 10 and memory layer 11, or as a structural part separate from the reference layer 10 and memory layer 11. For example, a shift control layer (not shown) may be provided between the electrode and the reference layer 10.

A lower electrode 15 is provided at a bottom part of the multilayer structure 100 which forms the magnetic tunnel junction of the MTJ element 1, and the upper electrode 17 is provided at an upper part of the multilayer structure 100.

The lower electrode 15 is provided on the contact plug CP1. In the case where the magnetic layer 10 has magnetocrystalline anisotropy, it is desirable that the lower electrode 15 function as an underlayer (a lattice matching film or a buffer layer) for promoting crystal growth of the magnetic layer 10 which is in contact with the lower electrode 15. In this case, the material, which is used for the lower electrode 15, is selected in accordance with the material that is used for the magnetic layer 10.

The upper electrode 17 is provided on the magnetic layer 11 of the multilayer structure. The upper electrode 17 is used as a hard mask for processing the magnetic layers 10 and 11 and nonmagnetic layer 12 at a time of forming the MTJ element. Thus, in the cell array 90, the upper electrode 17 is provided so as to correspond to each of the MTJ elements 1, and the upper electrode 17 is independent in association with each MTJ element 1. In addition, the upper electrode 17 has a shape corresponding to the shape of the MTJ element that is to be formed and, for example, the upper electrode 17 has a columnar shape.

A corner portion of the upper part (the part on the bit line side) of the upper electrode 17 is chamfered by etching at a time of forming the MTJ element. Thus, the upper electrode 17 has, for example, a hexagonal cross-sectional shape. A thickness (height) Tb of an end portion (outer peripheral portion) of the upper electrode 17 is less than a thickness Ta of a central portion 170 of the upper electrode 17.

At the bottom part of the upper electrode 17, the upper electrode 17 has a maximum dimension Dm1 in a parallel direction to the surface of the semiconductor substrate. For example, the maximum dimension Dm1 of the upper electrode 17 in the parallel direction to the surface of the semiconductor substrate is set in a range of about 20 nm to 35 nm. However, the dimension Dm1 of the upper electrode may be greater than 35 nm or may be less than 20 nm.

As the material of the upper electrode 17, for example, use is made of a single layer film of at least one material selected from among tungsten (W), tantalum (Ta), titanium (Ti) and titanium nitride (TiN), or a multilayer formed of a combination of these materials.

A cap layer 16 is provided between the upper electrode 17 and the magnetic tunnel junction 100.

The cap layer 16 has a film thickness of, for example, about 1 nm to 5 nm. For example, a film (single layer film or multilayer film) including at least one of materials, such as ruthenium, platinum and tantalum, is used for the cap layer 16. The cap layer 16 functions as a protection film. The cap layer 16 may be treated as a part of the upper electrode (hard mask) 17, or may be treated as a part of the magnetic tunnel junction 100.

A side wall film 19A is provided on the side surface of the upper electrode 17.

The side wall film 19A is formed of a material which is different from the material of the upper electrode 17. For the side wall film 19, use is made of a material which is less easily etched by a reactive gas, such as a halogen-containing gas, than the material of the upper electrode 17. In the case where the side wall film 19A is formed of a material having a resistance to a halogen, the side wall film 19A is formed of a noble metal. In this case, ruthenium (Ru) or platinum (Pt), for instance, is used as the material of the side wall film 19A.

The side wall film 19A is provided on the side surface of the upper electrode 17 such that the side wall film 19A surrounds the side surface of the columnar upper electrode 17. The side wall film 19A has, for example, a cylindrical structure. The side wall film 19A on the side surface of the upper electrode 17 is provided on the upper surface of the multilayer structure 100 (magnetic layer 11). For example, a thickness t1 of the side wall film 19A in the parallel direction to the surface of the semiconductor substrate is set in a range of about 3 nm to 10 nm.

The side wall film 19A may be treated as a part of the upper electrode 17. As will be described later, when the multilayer structure 100 including the magnetic layers 10 and 11 is processed, the side wall film 19A is provided on the side surface of the hard mask (upper electrode) 17. Thus, the side wall film 19A has a function of a hard mask. A portion 171 with a small film thickness in the upper electrode 17 is provided between the side wall film 19A and the portion 170 with a large film thickness in the upper electrode 17.

In the case where the multilayer structure (magnetic tunnel junction) 100 has a tapered cross-sectional shape, the multilayer structure 100 has, on the upper electrode 17 side thereof, a minimum dimension Dm2 in the parallel direction to the surface of the semiconductor substrate, and has, on the lower electrode 15 side thereof, a maximum dimension Dm3 in the parallel direction to the surface of the semiconductor substrate. For example, the minimum dimension Dm2 of the multilayer structure 100 is substantially equal to a sum of double the thickness t1 of the side wall film 19A and the maximum dimension Dm1 of the upper electrode 17.

A side wall insulation film 13 is provided on the side surface of the MTJ element 1. For example, the side wall insulation film 13 covers a part of the upper surface of the upper electrode 17. The side wall insulation film 13 is provided on the side wall film 19A. The side wall film 19A is interposed between the upper electrode 17 and the side wall insulation film 13. The side wall insulation film 13 has a cylindrical structure. A compound film, such as a silicon nitride film, a silicon oxide film or an aluminum oxide (alumina) film, is used for the side wall insulation film 13. The film thickness of the side wall insulation film 13 is, for example, about 10 nm to 20 nm. However, the film thickness of the side wall insulation film 13 may be less than 10 nm or greater than 20 nm. It is desirable that the side wall insulation film 13 be formed conformal, in order to protect the MTJ element 1 from impurities (e.g. moisture or oxygen).

A via-plug TEC is provided on the upper electrode 17. The via-plug TEC is buried in a contact hole which is provided in an interlayer insulation film 81. For the via-plug TEC, for example, use is made of a single layer film of at least one material selected from among W, Ta, Ti and TiN, or a multilayer formed of a combination of these materials.

A bit line 55a is provided on the interlayer insulation film 81 such that the bit line 55a is connected to the via-plug TEC. A damascene-structured copper (Cu) wiring or an aluminum (Al) wiring is used for the bit line 55a.

In the magnetic memory of the embodiment, the side wall film 19A, which has a resistance to a reactive gas, is provided on the side surface of the upper electrode (hard mask) 17 of the magnetoresistive effect element 1.

In the manufacturing process of the magnetic memory, for example, a process (e.g. RIE) using a reactive gas as an etching gas, such as a step of forming a contact hole in the interlayer insulation film 81, is performed.

When this contact hole is formed, there may be a case in which the portion 171 with the small film thickness of the upper electrode 17, which functions as the hard mask, is exposed to the reactive gas atmosphere, due to, for example, misalignment between the mask and the wafer.

In this case, even if an etching selectivity is secured between the hard mask and the interlayer insulation film, it is possible that the portion with the small film thickness of the upper electrode serving as the hard mask, or the cap layer with the small film thickness is lost by over-etching for securing a process margin of the contact hole, and the magnetic layer (metal film) of the magnetoresistive effect element is exposed.

For example, when a halogen-based gas, which contains a halogen such as chlorine (Cl) or fluorine (F), is used for etching, it is possible that the magnetic layer in the magnetoresistive effect element is corroded by the halogen. This may possibly deteriorate the characteristics of the magnetoresistive effect element, and may degrade the reliability and manufacturing yield of the magnetic memory.

As in the present embodiment, the side wall film 19A of a noble metal such as Ru or Pt, which has a resistance to a reactive gas (in this example, halogen), is provided on the side surface of the upper electrode (hard mask) 17 that is provided on the upper part of the magnetoresistive effect element.

On the lateral-surface side of the upper electrode 17 which decreases in thickness due to ion milling, the side wall film 19A on the side surface of the upper electrode 17 is left on the magnetic layer 11 of the magnetoresistive effect element 1 when the interlayer insulation film 81 is etched by RIE, and the members on the magnetic layers 10 and 11 of the magnetoresistive effect element 1 are not lost by the reactive gas.

As a result, when etching is performed on the interlayer insulation film which covers the MTJ element, it is possible to prevent the magnetic layer included in the MTJ element from being corroded by a chemical species (e.g. halogen) included in the reactive gas.

Therefore, according to the magnetic memory (and the magnetoresistive effect element) of the embodiment, the reliability and manufacturing yield of the magnetic memory can be improved.

(b) Manufacturing Method

Referring to FIG. 7 to FIG. 11, a manufacturing method of the magnetic memory (e.g. MRAM) of the first embodiment is described. Also referring to FIG. 1 to FIG. 6, where necessary, the manufacturing method of the magnetic memory of the first embodiment is described.

For example, a device isolation insulation film of an STI structure is formed in formation regions of a cell array and a peripheral/core circuit in a semiconductor substrate. Thereby, a device isolation region and an active area are formed in the semiconductor substrate. For example, an insulative material with a high burying characteristic, such as SiN, is used for the device isolation insulation layer.

Cell transistors in memory cells, and transistors of the peripheral/core circuit are formed on the semiconductor substrate.

For example, a cell transistor with a buried gate structure is formed in the following manner. As illustrated in FIG. 2 to FIG. 4, for example, a recess extending in the Y direction is formed in the surface of the semiconductor substrate 41. A gate insulation film 43 is formed on an inner surface of a lower part of the recess.

A gate electrode 44 is formed on the inner surface of the gate insulation film 43 so as to fill the lower part of the recess.

An insulation film 45 which is formed of, for example, SiN is formed on the upper surfaces of the gate insulation film 43 and the gate electrode 44. The film thickness of the insulation film 45 is adjusted so that the upper surface of the insulation film 45 may be substantially on a level with the upper surface of the semiconductor substrate 41.

A diffusion layer 46a, 46b, which serves as a source/drain of the cell transistor, is formed by ion implantation in the semiconductor substrate 41 in a self-alignment manner in relation to the gate electrode 44 which is buried in the semiconductor substrate.

In addition, the transistor with a planar structure in the peripheral/core circuit is formed in the following manner. A gate insulation film is formed on the surface of the semiconductor substrate by, for example, a thermal oxidation method. A polysilicon film is deposited on the gate insulation film by, for example, a CVD method. The polysilicon film is processed to have a predetermined shape by photolithography and etching, and a gate electrode of the transistor is formed. By a fabrication step which is performed substantially at the same time as the fabrication step of the transistor with the buried gate structure, a diffusion layer, which serves as a source/drain, is formed in the semiconductor substrate in a self-alignment manner in relation to the gate electrode on the surface of the semiconductor substrate.

Incidentally, the recess in the surface of the semiconductor substrate 41 may be formed by a sidewall transfer process technology so as to have a size (line width) which is smaller than a limit dimension of resolution by lithography. Thereby, a transistor having a gate size, which is less than the limit dimension of resolution of lithography, can be formed.

FIG. 7 is a cross-sectional view illustrating a fabrication step of the manufacturing process of the MRAM of the embodiment.

As illustrated in FIG. 7, an interlayer insulation film (e.g. silicon oxide film) 80 is deposited by, e.g. CVD, on the semiconductor substrate on which cell transistors and core transistors have been formed.

A contact hole is formed at a predetermined position in the interlayer insulation film 80. A contact plug CP1 is buried in the contact hole.

After the contact plug CP1 is formed in the interlayer insulation film 80, an electrically conductive layer 15x for forming a lower electrode of a magnetoresistive effect element is deposited on the interlayer insulation film 80.

A first magnetic layer 10X, a nonmagnetic layer 12X and a second magnetic layer 11X are successively deposited on the conductive layer 15X. For example, at least one selected from among CoFeB, CoPt and a ferrimagnetic material is used for the first and second magnetic layers (alloy films or artificial lattices) 10X and 11X. An insulative film (tunnel barrier film) consisting mainly of MgO is used for the nonmagnetic layer 12X. In order to make the magnetization inversion threshold of one of the two magnetic layers 10X and 11X greater than the magnetization inversion threshold of the other, the two magnetic layers 10X and 11X are deposited such that the film thickness of the one magnetic layer becomes greater than the film thickness of the other magnetic layer. Thereby, a reference layer and a memory layer of the magnetoresistive effect element are formed.

In this manner, a multilayer structure 100X for forming a magnetic tunnel junction is formed on the conductive layer (lower electrode) 15X on the interlayer insulation film 80.

In addition, a cap layer 16 having a thickness of, for example, about 1 nm to 5 nm is deposited on the magnetic layer 11X of the multilayer structure 100X. For example, at least one of ruthenium, platinum and tantalum is used for the cap layer 16.

An electrically conductive layer 17, which becomes a hard mask, is deposited on the cap layer 16 of the magnetic layer 11X. A conductor is used for the hard mask 17. For example, a single layer film of at least one material selected from among tungsten (W), tantalum (Ta), titanium (Ti) and titanium nitride (TiN), or a multilayer formed of a combination of these materials, is used for the hard mask 17.

A resist mask is formed on the hard mask 17 by lithography. The hard mask 17 is patterned by, for example, etching using the resist mask as a mask. The plan-view shape of the patterned hard mask corresponds to the plan-view shape of an MTJ element that is to be formed. For example, the plan-view shape of the patterned hard mask 17 is circular (or elliptic). The patterned hard mask 17 has a columnar structure. The hard mask 17 is formed to have a film thickness of, for example, about 20 nm to 30 nm. In addition, as regards the patterned hard mask 17, the dimension (maximum dimension) of the hard mask 17 in a parallel direction to the surface of the semiconductor substrate is set in a range of, for example, about 20 nm to 30 nm. In the meantime, a plurality of hard masks 17 are formed in an array on the multilayer structure 100, so that one magnetoresistive effect element is formed for one hard mask.

The patterned hard mask 17 is formed at a position overlapping the position of formation of the magnetoresistive effect element in a direction perpendicular to the surface of the semiconductor substrate. In the example illustrated in FIG. 7, the hard mask 17 is formed above the contact plug CP1 in the perpendicular direction to the surface of the semiconductor substrate.

FIG. 8 is a cross-sectional view illustrating a fabrication step of the manufacturing process of the MRAM of the embodiment.

As illustrated in FIG. 8, after the resist mask is removed, an electrically conductive film 19X is deposited on the hard mask 17 and multilayer structure 100 so as to cover the patterned hard mask 17. Thereby, a side wall film 19X is formed on the side surface of the patterned hard mask 17. As regards the reactive gas for use in reactive ion etching (RIE), a material having a low etchability characteristic (a material with resistance to etching) with respect to a chemical species in the reactive gas, such as a halogen, is used for the conductive film (side wall film) 19X. When a halogen-based gas is used for RIE, a noble metal, for example, is used for the conductive film 19X, and ruthenium (Ru) or platinum (Pt), for instance, is used. The conductive film 19X is deposited so as to have a film thickness of, for example, about 10 nm. When Ru is used for the conductive film 19X, the Ru film 19X is deposited by, for example, CVD. In addition, when Pt is used for the conductive film 19X, the Pt film 19X is deposited by, for example, sputtering.

Figure 9:
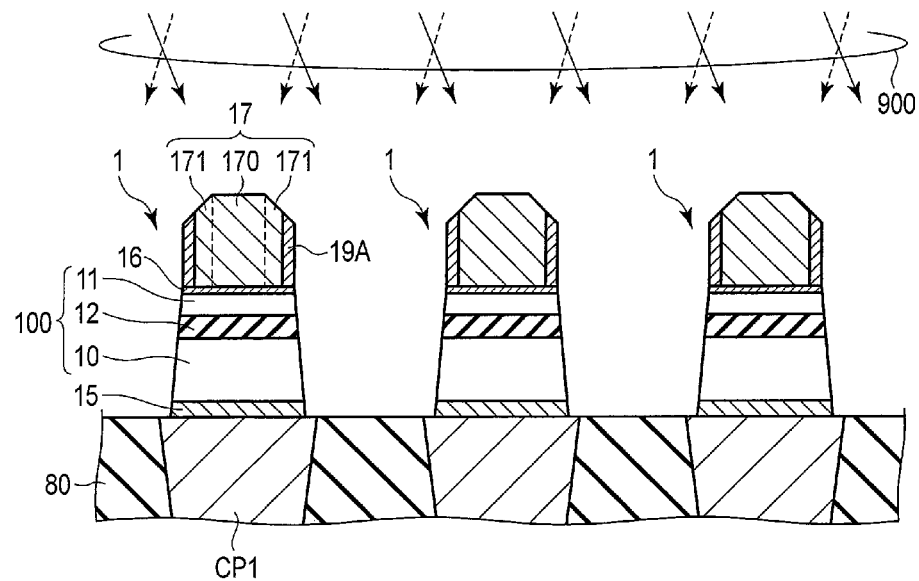
FIG. 9 is a cross-sectional view illustrating a fabrication step of the manufacturing method of the magnetic memory of the first embodiment.

FIG. 9 is a cross-sectional view illustrating a fabrication step of the manufacturing process of the MRAM of the embodiment.

As illustrated in FIG. 9, in the state in which the hard mask 17 is covered with the conductive film (noble metal film and side wall film) 19, etching is performed for forming the magnetoresistive effect element (MTJ element) by using the hard mask 17 as a mask.

Ion milling is used for the etching for forming the magnetoresistive effect element. An ion beam 900 for the ion milling is radiated on the hard mask 17 and multilayer structure 100 in an oblique direction to the surface of the semiconductor substrate, while the semiconductor substrate is being rotated.

Thereby, the multilayer structure 100 of the magnetic layers 10 and 11 and nonmagnetic layer 12 is processed so as to have a pattern corresponding to the hard mask 17, and an MTJ element 1 is formed on the interlayer insulation film 80. In addition, a lower electrode 15 of the MTJ element 1 is formed between the magnetic layer 10 and the contact plug. For example, the multilayer structure 100 in the formed MTJ element 1 has a tapered cross-sectional shape, and the dimension of the bottom side (lower electrode side) of the MTJ element 1 is greater than the dimension of the upper side (hard mask side) of the MTJ element 1.

After the MTJ element 1 is formed, the hard mask 17 is not removed and is left on the MTJ element 1. The hard mask that is left is used for the upper electrode 17 of the MTJ element 1. The side wall film 19A, which is formed of the noble metal film, is left on the side surface of the hard mask (upper electrode) 17. The side wall film 19 functions as a part of the hard mask.

By the ion milling, a corner portion of the upper part of the hard mask 17 is chamfered, and the film thickness of an end portion (outer peripheral portion) 171 of the hard mask 17 in the parallel direction to the surface of the semiconductor substrate becomes less than the film thickness of a central part 170 of the hard mask.

The film thickness (the dimension in the parallel direction to the surface of the semiconductor substrate) of the noble metal film (side wall film) 19A, which is left on the side surface of the hard mask 17, is in a range of, for example, about 3 nm to 10 nm. In the meantime, the thickness of the noble metal film 19A at the time of deposition is controlled so that the side wall film (noble metal film) 19A may not be lost from the side surface of the hard mask 17 by the ion milling.

For example, a side wall insulation film 13 is deposited on the side surface of the MTJ element 1 by using ALD or CVD. At least one selected from among a silicon nitride film, a silicon oxide film and an aluminum oxide (alumina) film is used for the side wall insulation film 13. The film thickness of the side wall insulation film 13 is, for example, about 10 nm to 20 nm. It is desirable that the side wall insulation film 13 be formed conformal, in order to protect the MTJ element 1. In the meantime, after one of the two magnetic layers, namely, the magnetic layer 11 on the hard mask 17 side, is etched, the processing of the multilayer structure may be temporarily suspended before processing the nonmagnetic layer 12, and an insulation film may be deposited on the side surface of the processed magnetic layer 11 (and side wall film). Thereafter, the nonmagnetic layer, magnetic layer and lower electrode on the lower side may be successively processed by etching (e.g. ion milling) using as a mask the magnetic layer 11 having the side surface covered with the insulation film.

Figure 10:
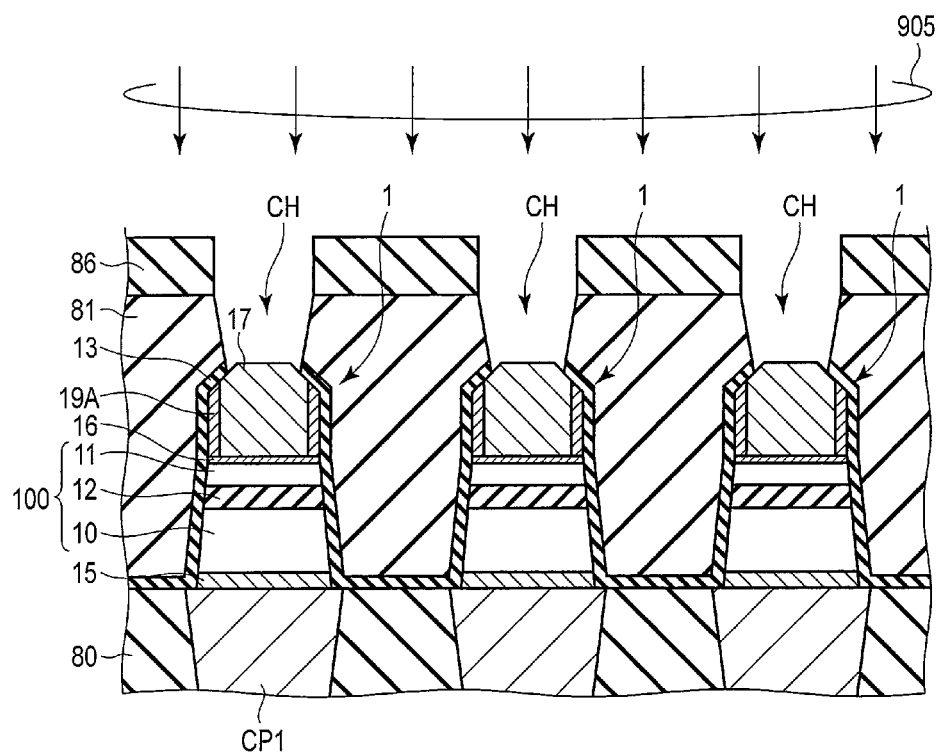
FIG. 10 is a cross-sectional view illustrating a fabrication step of the manufacturing method of the magnetic memory of the first embodiment.
Figure 11:
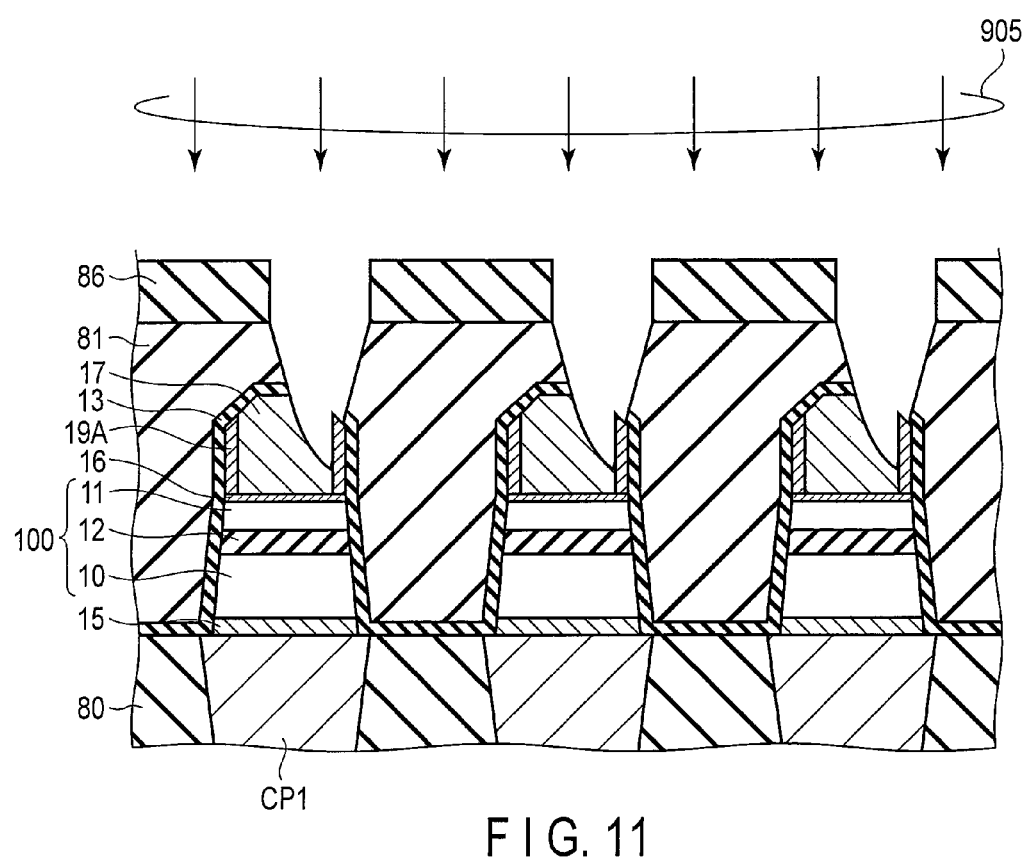
FIG. 11 is a cross-sectional view illustrating a fabrication step of the manufacturing method of the magnetic memory of the first embodiment.

FIG. 10 and FIG. 11 are cross-sectional views illustrating fabrication steps of the manufacturing method of the MRAM of the embodiment.

As illustrated in FIG. 10, a second interlayer insulation film 81 is deposited on the first interlayer insulation film 80 so as to cover the MTJ element 1.

For example, using lithography and RIE, a mask layer (e.g. resist mask) 86 with a predetermined pattern is formed on the interlayer insulation film 81. A contact hole (opening portion) is formed in the mask layer 86 at a position corresponding to the MTJ element 1 in the X-Y plane.

Based on the pattern of the mask layer 86, a contact hole is formed in the interlayer insulation film 81 by etching (RIE) using as an etching gas a gas containing a halogen such as chlorine (Cl) or fluorine (F) (hereinafter referred to as "halogen-based gas"), so as to expose the upper electrode (hard mask) 17 of the MTJ element 1. For example, taking into account the non-uniformity in film thickness of the interlayer insulation film 81, the interlayer insulation film 81 is over-etched. Thereby, the upper part of the upper electrode 17 of the MTJ element 1 is exposed.

At this time, as illustrated in FIG. 11, when the mask layer is patterned by lithography, if the exposure mask (photomask) and the semiconductor substrate (wafer) are misaligned, it is possible that the position of the opening portion of the mask layer is displaced from the position of the MTJ element. In this case, at the time of RIE on the interlayer insulation film 81, the portion 171 with the small film thickness of the hard mask 17 is exposed to the reactive gas atmosphere from a contact hole CH that is formed. Then, by RIE, an upper end corner portion of the hard mask 17 is etched to a high degree. Thus, even if an etching selectivity between the hard mask 17 and the interlayer insulation film 81 is secured, it is possible that the portion with the small film thickness of the hard mask 17 is etched by the RIE using the reactive gas (e.g. halogen gas) as the etching gas, and is removed from the multilayer structure 100.

At the time of forming the contact hole, the side wall insulation film 13, which covers the hard mask 17, is formed of the compound film and has a small film thickness. Thus, by the etching using the reactive gas, the side wall insulation film 13 is removed from the hard mask 17.

In addition, in the case where the hard mask 17 has been removed from above the multilayer structure 100, since the film thickness of the cap layer 16 on the multilayer structure 100 is small, it is possible that the cap layer 16, together with the hard mask 17, is removed by etching.

In the present embodiment, the side wall film 19A, which is formed of the material with a low etchability characteristic (the material with a resistance to etching) with respect to the reactive gas (in this example, the halogen-based gas) for etching, is provided on the side surface of the hard mask (upper electrode) 17 on the magnetic layer 11. The side wall film 19A serves as a barrier film to the halogen on the magnetic layer 11 of the MTJ element 1.

The etching rate of the material (e.g. Ru or Pt) of the side wall film 19A with respect to the halogen-based gas is lower than the etching rate of the material (e.g. W) of the hard mask 17 with respect to the halogen-based gas. Thus, even if there is such a tendency that the film thickness of the hard mask 17 becomes smaller at the side surface portion 171 thereof than at the central part 170 thereof due to the ion milling for processing the multilayer structure 100, the side wall film 19A remains on the side surface of the hard mask 17 at the time when the interlayer insulation film 81 is being etched, and the side wall film 19A covers the upper surface of the magnetic layer 11 of the multilayer structure 100.

In addition, at the time of the ion milling for forming the MTJ element, since the side wall film 19A is provided on the side surface of the hard mask 17, the side wall film 19A functions as a part of the mask for processing the multilayer structure including the magnetic layers 10 and 11. As a result, as regards the mask material covering the magnetic layer 11 of the MTJ element 1, that part of the hard mask 17 on the magnetic layer 11, which is easily etched by the halogen gas, decreases, and, instead of the hard mask formed of this material, the film (for instance, a noble metal film of, e.g. Ru) 19A which is formed of a material that is not easily etched by the halogen is provided on the magnetic layer 11.

Since the noble metal film 19A remains on the magnetic layer 11, the entrance of the halogen from a gap between the hard mask and the magnetic layer 11 can be suppressed.

Accordingly, when the interlayer insulation film 81 is etched, the magnetic layer is prevented from being exposed to the reactive gas atmosphere, and the corrosion of the magnetic layer due to the chemical species (in this example, the halogen) for etching is prevented.

In the case of the example illustrated in FIG. 11, an upper end of a part of the upper electrode 17 retreats to the semiconductor substrate side by the etching by RIE, and this upper end is located more on the semiconductor substrate side than the upper end of the side wall film 19A.

After the fabrication step illustrated in FIG. 10 (or FIG. 11), the plug TEC is buried in the contact hole formed in the interlayer insulation film 81 such that the plug TEC is connected to the upper electrode 17 of the MTJ element 1, as illustrated in FIG. 6. In addition, as shown in FIG. 3 and FIG. 4, contact plugs CP2 are formed in the interlayer insulation films 80 and 81. The bit lines BL, bBL, which are formed of metal films of, e.g. copper (Cu), are formed on the interlayer insulation film 81, plugs TEC and contact plugs CP2.

Thereafter, wirings and interlayer insulation films are successively formed in the cell array and core/peripheral circuit areas by multilayer wiring technology.

Through the above-described fabrication steps, the MRAM (magnetic memory) of the embodiment is formed.

In the manufacturing method of the MRAM of the embodiment, the side wall film (e.g. a noble metal film such as a Ru film), which has a high resistance to the reactive gas (e.g. a halogen-based gas), is formed on the side surface of the hard mask (the upper electrode of the magnetoresistive effect element).

Thereby, as has been described with reference to FIG. 10 and FIG. 11, in the fabrication step of forming the contact hole in the interlayer insulation film 81 covering the magnetoresistive effect element 1, even when the etching by the reactive gas is performed in the state in which the film thickness of the end portion (side surface portion) 171 of the hard mask (the upper electrode of the magnetoresistive element) in the parallel direction to the surface of the semiconductor substrate is less than the central portion 170 of the hard mask 17, the side wall film 19A is left on the side surface of the hard mask and on the upper surface of the magnetic layer.

Therefore, in the present embodiment, the member covering the upper side of the end portion of the magnetic layer 11 is not lost by the etching by the reactive gas, and the magnetic layer is not exposed to the reactive gas at the time of the etching by the reactive gas.

As a result, in the manufacturing method of the magnetic memory of the embodiment, it is possible to suppress the occurrence of corrosion of the magnetic layer due to the reactive gas for etching the interlayer insulation layer.

Thus, according to the manufacturing method of the magnetic memory (or the magnetoresistive effect element) of the embodiment, the reliability and manufacturing yield of the magnetic memory can be improved.

(2) Second Embodiment

Referring to FIG. 12 to FIG. 16, a description is given of a structure and a manufacturing method of a magnetic memory (e.g. MRAM) according to a second embodiment.

In the second embodiment, the same structural parts as those in the first embodiment are denoted by like reference numerals, and a description thereof is omitted.

(a) Structure

Referring to FIG. 12, the structure of the magnetic memory (e.g. MRAM) according to the second embodiment is described.

FIG. 12 is a view which schematically shows a cross-sectional structure of a magnetoresistive effect element (MTJ element) included in an MRAM according to the second embodiment. Since the plan-view structure of the magnetoresistive effect element of the MRAM of the embodiment is substantially the same as the structure shown in FIG. 5, the depiction and description thereof are omitted here. In addition, since the structure of the cell transistor included in the MRAM of the present embodiment is the same as in the first embodiment, the description and depiction thereof are omitted here.

As illustrated in FIG. 12, in the MTJ element 1 included in the MRAM of the second embodiment, a film 19B, which is formed of the same material as the side wall film 19A on the side surface of the upper electrode 17, is provided at a bottom part of the upper electrode (hard mask) 17. In the description below, the film 19B provided at the bottom part of the upper electrode 17 is referred to as "bottom-part film 19B".

The bottom-part film 19B is a noble metal film (e.g. an Ru film or a Pt film) which is continuous with the side wall film 19A. The noble metal films 19A and 19B including the side wall film 19A and bottom-part film 19B have a concave cross-sectional shape.

A film thickness t2 of the bottom-part film 19B in a direction perpendicular to the surface of the semiconductor substrate is substantially equal to the film thickness t1 of the side wall film 19A in the parallel direction to the surface of the semiconductor substrate. For example, the bottom-part film 19 has a thickness of about 3 nm to 10 nm.

The bottom-part film 19B is provided between the upper electrode 17 and the magnetic layer (in this example, the memory layer) 11, and covers the upper surface of the magnetic layer 11.

In the present embodiment, when the interlayer insulation film is etched by the reactive gas such as a halogen-based gas, since the side wall film 19A of the noble metal with the resistance to the halogen gas is provided on the side surface of the hard mask (upper electrode), it is possible to prevent the member covering the upper part of the end portion of the magnetic layer 10, 11 from being lost by the etching using the halogen-based gas.

Even if the portion with the small film thickness of the upper electrode 17 is removed from above the magnetic layer 10, 11 by over-etching on the interlayer insulation film 81, the bottom-part film 19B which is formed of the noble metal is left on the multilayer structure 100.

Therefore, by the bottom-part film 19B formed of the noble metal which is left on the multilayer structure 100, the magnetic layer 11 can be prevented from being exposed to the halogen-based gas atmosphere.

In this manner, in the present embodiment, too, it is possible to suppress the corrosion of the magnetic layer due to the reactive gas (etching gas) such as a halogen gas.

Besides, by the bottom-part film 19B formed of the noble metal, peeling of the upper electrode (hard mask) 17 can be prevented.

Thus, according to the magnetic memory of the second embodiment, the reliability and manufacturing yield of the magnetic memory can be improved.

(b) Manufacturing Method

Referring to FIG. 13 to FIG. 16, a manufacturing method of the magnetic memory (e.g. MRAM) of the second embodiment is described. Also referring to FIG. 1 to FIG. 12, where necessary, the manufacturing method of the magnetic memory of this embodiment is described.

FIG. 13 is a cross-sectional view illustrating a fabrication step of the manufacturing process of the MRAM of the embodiment.

As illustrated in FIG. 13, by the same fabrication steps as in the first embodiment, an interlayer insulation film 80 is deposited on the semiconductor substrate on which transistors have been formed, and contact plugs CP1 are formed at predetermined positions of the interlayer insulation film 80.

Then, by the same fabrication steps as in the first embodiment, a multilayer structure (magnetic layers and tunnel barrier layer) 100X for forming an MTJ element of the MRAM is successively deposited on the interlayer insulation film 80 and contact plug CP1.

In the present embodiment, a dummy layer 89 is deposited on the multilayer structure 100X by, e.g. CVD. For example, one of a silicon oxide film, a silicon nitride film and an organic film is used for the dummy layer 89.

An opening OP1 is formed in the dummy layer 89 by photolithography and etching so as to correspond to a position of formation of the MTJ element. The opening portion OP1 is formed at a position overlapping the contact plug CP1 in the perpendicular direction to the surface of the semiconductor substrate. The opening portion OP1 has a circular or elliptic plan-view shape, and a columnar cavity is formed in the dummy layer 89 by the opening portion OP1. By the opening portion OP1, the upper surface of the cap layer 16 on the multilayer structure 100X is exposed.

After the opening portion OP1 is formed in the dummy layer 89, an electrically conductive film (e.g. a noble metal film of Ru, etc.) 19X is deposited on the dummy layer 89 and the multilayer structure (the cap layer of the multilayer structure) 100X by, CVD or sputtering.

FIG. 14 is a cross-sectional view illustrating a fabrication step of the manufacturing process of the MRAM of the embodiment.

As illustrated in FIG. 14, an electrically conductive layer 17Z for forming a hard mask is deposited on the deposited conductive film 19X. The conductive layer 17Z is filled in the opening portion OP1 of the dummy layer 89.

Figure 15:
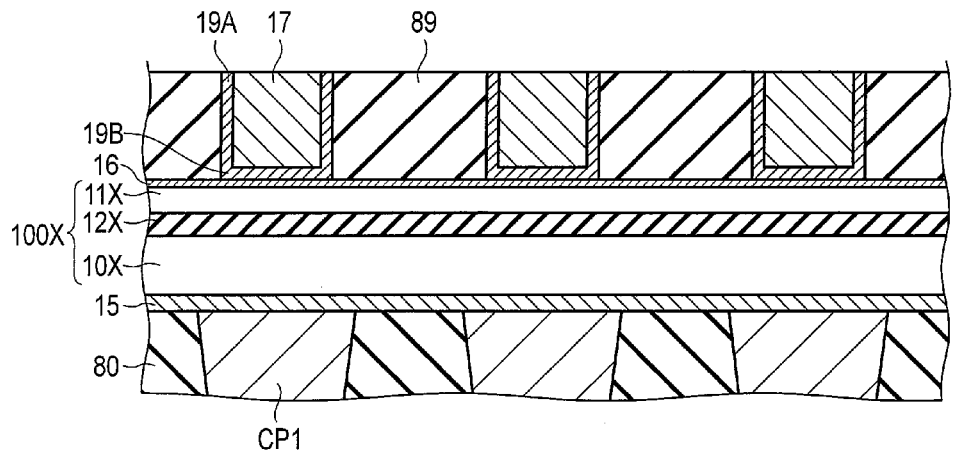
FIG. 15 is a cross-sectional view illustrating a fabrication step of the manufacturing method of the magnetic memory of the second embodiment.

FIG. 15 is a cross-sectional view illustrating a fabrication step of the manufacturing process of the MRAM of the embodiment.

As illustrated in FIG. 15, using the dummy layer 89 as a stopper, CMP, RIE, or a process of CMP and RIE combined, is performed on the conductive layer on the dummy layer 89. Thereby, the conductive layer 17 is left in the opening portion OP1 of the dummy layer 89 in a self-alignment manner, and a hard mask 17 corresponding to the pattern of the MTJ element is formed above the contact plug CP1. Noble metal films 19A and 19B are left between the hard mask 17 and the dummy layer 89. The noble metal films 19A and 19B are provided on the side surface and bottom surface of the hard mask 17. For example, a noble metal film on the upper surface of the dummy layer 89 is removed.

For example, by the provision of the noble metal film 19B between the hard mask 17 and the multiplayer structure 100, the adhesion between the hard mask 17 and the multilayer structure 100 is improved, and peeling of the hard mask 17 from the multilayer structure 100 can be prevented.

Figure 16:
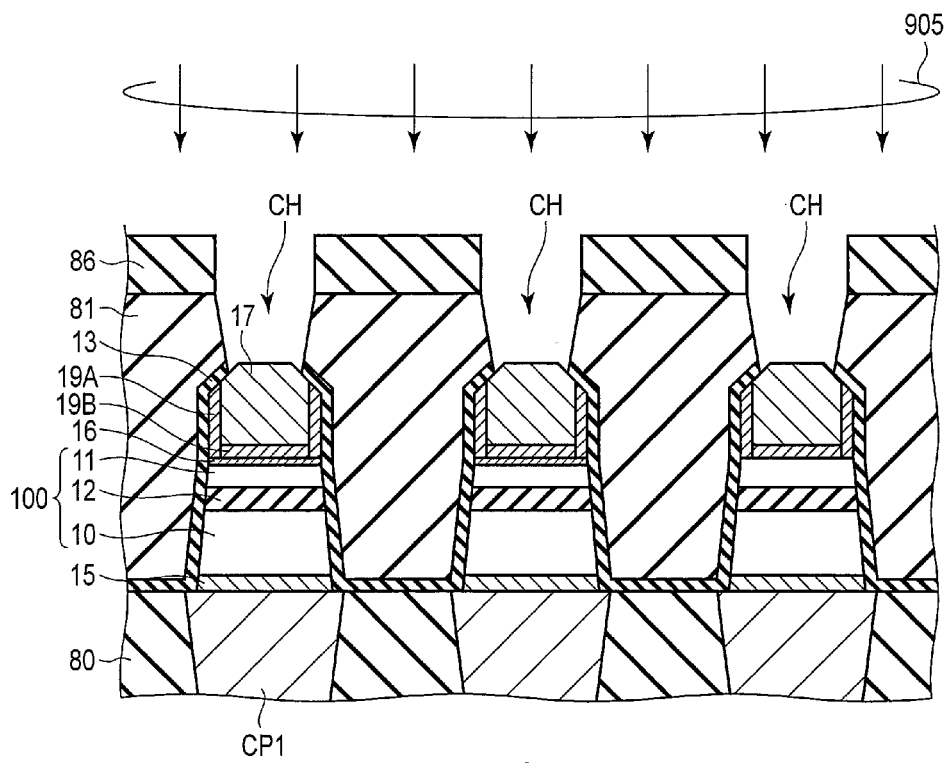
FIG. 16 is a cross-sectional view illustrating a fabrication step of the manufacturing method of the magnetic memory of the second embodiment.

FIG. 16 is a cross-sectional view illustrating a fabrication step of the manufacturing process of the MRAM of the embodiment.

As illustrated in FIG. 16, after the dummy layer has been selectively removed, the multilayer structure is processed by the ion milling using the hard mask 17 as a mask, like the first embodiment. Thereby, the MTJ element 1 is formed.

By the etching by the ion milling, the film thickness of the end portion (side surface portion) of the hard mask 17 becomes smaller than the film thickness of the central portion of the hard mask 17.

Then, like the first embodiment, a second interlayer insulation film (e.g. a silicon oxide film) 81 is deposited by, e.g. CVD on the first interlayer insulation film 80 so as to cover the MTJ element 1.

A contact hole CH for burying the via-plug is formed in the second interlayer insulation film 81 by RIE using a halogen-based gas.

Since the film (the noble metal film such as a Ru film) 19A, 19B, which has the resistance to a halogen, is formed on the side surface of the hard mask (upper electrode) 17, the films 17, 19A and 19B covering the upper side of the magnetic layer 10, 11 can be prevented from being lost on the end portion side of the MTJ element 1 in the parallel direction to the surface of the semiconductor substrate, when the interlayer insulation film 81 is etched.

In addition, even if a part of the hard mask 17 is lost from above the magnetic layer 11, the noble metal film 19B, which has the resistance to the halogen, covers the upper surface of the magnetic layer 11. Furthermore, in the embodiment, since the noble metal film 19A, 19B is formed between the magnetic layer 11 and the hard mask 17, the entrance of the halogen to the interface between the hard mask 17 and the magnetic layer 11 can be suppressed.

Therefore, in the embodiment, the corrosion of the magnetic layer 10, 11 of the MTJ element 1 by Cl or F contained in the reactive gas can be prevented.

Thereafter, like the first embodiment, bit lines and wirings of the peripheral/core circuit are successively formed, and the MRAM of the embodiment is formed.

As has been described above, in the present embodiment, the films (e.g. noble metal films) 19A, 19B, which have a higher resistance to the chemical species (e.g. a halogen such as Cl or F) contained in the reactive gas than the material of the hard mask 17, are formed on the side surface and bottom surface of the hard mask (upper electrode) 17. Thereby, the magnetic layer of the magnetoresistive effect element can be prevented from being corroded by the etching using the reactive gas in the fabrication steps of the magnetic memory.

Therefore, according to the manufacturing method of the magnetic memory of the second embodiment, the reliability and manufacturing yield of the magnetic memory can be improved.

(3) Modification

Referring to FIG. 17, a modification of the magnetic memory of the embodiment is described.

FIG. 17 is a view which schematically illustrates a cross-sectional structure of a magnetoresistive effect element (MTJ element) included in an MRAM according to a modification of the embodiment.

In the magnetoresistive effect element of the magnetic memory of the embodiment, the side wall film 19A formed of the material, which has a higher resistance to the reactive gas (e.g. halogen) than the material of the hard mask (upper electrode), is provided on the side surface of the upper electrode 17 functioning as the hard mask.

For example, when the material of the upper electrode 17 has a higher etching rate than the material of the side wall film 19A with respect to the halogen, it is possible that a dimension (height) H2 of the upper electrode 17 in the perpendicular direction to the surface of the semiconductor substrate becomes smaller than a dimension H2 of the side wall film 19A in the perpendicular direction to the surface of the semiconductor substrate.

In the example illustrated in FIG. 17, the entirety of the upper portion of the upper electrode 17 retreats more on the semiconductor substrate side (multilayer structure 100 side) than the upper end of the side wall film 19A. However, as illustrated in FIG. 11, a part of the upper portion of the upper electrode 17 may be located more on the semiconductor substrate side than the upper end of the side wall film 19A.

Also in the modification illustrated in FIG. 17, when the etching using the reactive gas (e.g. halogen-based gas) is performed at the time of the fabrication step of the MRAM, since the side wall film (e.g. noble metal film) 19A, 19B is provided on the side surface of the hard mask 17, the corrosion of the magnetic layer due to the halogen can be prevented.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic memory comprising:
a magnetoresistive effect element provided on a substrate, the magnetoresistive effect element including:
a multilayer structure including a first magnetic layer, a second magnetic layer, and a nonmagnetic layer between the first magnetic layer and the second magnetic layer;
a first electrode provided on an upper surface of the multilayer structure and formed of a first material;
a first film provided on a side surface of the first electrode, surrounding the first electrode, and formed of a second material which is different from the first material, wherein the second material is a noble metal; and
a second film which is provided between the first electrode and the multilayer structure, which is formed of the second material, and which is continuous with the first film.

2. The magnetic memory according to claim 1, wherein the first material is selected from at least one of tungsten, tantalum, titanium and titanium nitride, and the second material is selected from ruthenium and platinum.

3. The magnetic memory according to claim 1, wherein the first film is also provided on an upper surface of the multilayer structure.

4. The magnetic memory according to claim 1, wherein the first electrode includes:
a first portion with a first film thickness; and
a second portion with a second film thickness which is less than the first film thickness, the second portion being provided between the first portion and the first film.

5. The magnetic memory according to claim 1, wherein the first electrode includes a third portion which is less in height than the first film.

6. The magnetic memory according to claim 1, wherein a maximum dimension of the first electrode in a direction parallel to a surface of the substrate is less than a minimum dimension of the multilayer structure in the direction parallel to the surface of the substrate.

7. The magnetic memory according to claim 1, wherein a plan-view shape of the first electrode is circular or elliptic, and a plan-view shape of the multilayer structure is also circular or elliptic.

8. The magnetic memory according to claim 7, wherein the first film has a cylindrical structure.

9. A manufacturing method of a magnetic memory, comprising:
forming a multilayer structure on a substrate, the multilayer structure including a first magnetic layer, a second magnetic layer, and a nonmagnetic layer between the first magnetic layer and the second magnetic layer;
forming a dummy layer on the multilayer structure;

forming an opening portion in the dummy layer;
forming a first film on a side surface of the opening portion, and forming a second film on the multilayer structure;
forming a first mask on the first film, the first mask formed of a first material;
selectively removing the dummy layer;
processing the multilayer structure by etching using the first mask and the first film as a mask, thereby forming a magnetoresistive effect element;
forming an interlayer insulation film on the magnetoresistive effect element, the first mask and the first film; and
forming an opening portion in the interlayer insulation film so as to expose the first mask,
wherein the first film and the second film are formed of a second material which is different from the first material.

10. The manufacturing method according to claim 9, wherein the opening portion is formed by etching using a gas containing a halogen.

11. The manufacturing method according to claim 9, wherein an etching rate of the second material with respect to an etching gas is lower than an etching rate of the first material with respect to the etching gas.

12. The manufacturing method according to claim 9, wherein the second material is a noble metal.

13. The manufacturing method according to claim 9, wherein the first material is selected from at least one of tungsten, tantalum, titanium and titanium nitride, and the second material is selected from ruthenium and platinum.

* * * * *